US009466686B2

(12) United States Patent
Chen et al.

(10) Patent No.: US 9,466,686 B2
(45) Date of Patent: *Oct. 11, 2016

(54) GRAPHENE DEVICES WITH LOCAL DUAL GATES

(71) Applicant: International Business Machines Corporation, Armonk, NY (US)

(72) Inventors: Zhihong Chen, Valhalla, NY (US); Aaron Daniel Franklin, Croton-on-Hudson, NY (US); Shu-Jen Han, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/661,273

(22) Filed: Mar. 18, 2015

(65) Prior Publication Data
US 2015/0325672 A1 Nov. 12, 2015

Related U.S. Application Data

(63) Continuation of application No. 12/986,342, filed on Jan. 7, 2011, now Pat. No. 9,076,873, and a continuation of application No. 13/613,198, filed on Sep. 13, 2012, now Pat. No. 9,082,856.

(51) Int. Cl.
H01L 29/66 (2006.01)
H01L 29/16 (2006.01)
(Continued)

(52) U.S. Cl.
CPC ... *H01L 29/66045* (2013.01); *H01L 21/02178* (2013.01); *H01L 21/02181* (2013.01); *H01L 21/02527* (2013.01); *H01L 21/044* (2013.01);
(Continued)

(58) Field of Classification Search
CPC .................................................. H01L 29/1606
See application file for complete search history.

(56) References Cited

U.S. PATENT DOCUMENTS 5,580,802 A 12/1996 Mayer et al.
6,251,714 B1 6/2001 Dennison et al.
(Continued)

FOREIGN PATENT DOCUMENTS

CN 101325218 A 12/2008
CN 101777583 A 7/2010

OTHER PUBLICATIONS

Y. Zhang et al., "Direct Observation of a Widely Tunable Bandgap in Bilayer Graphene," Nature, Jun. 2009, pp. 820-823, vol. 459.
(Continued)

Primary Examiner — Eugene Lee
(74) Attorney, Agent, or Firm — Vazken Alexanian; Ryan, Mason & Lewis, LLP

(57) ABSTRACT

An electronic device comprises an insulator, a local first gate embedded in the insulator with a top surface of the first gate being substantially coplanar with a surface of the insulator, a first dielectric layer formed over the first gate and insulator, and a channel. The channel comprises a bilayer graphene layer formed on the first dielectric layer. The first dielectric layer provides a substantially flat surface on which the channel is formed. A second dielectric layer formed over the bilayer graphene layer and a local second gate formed over the second dielectric layer. Each of the local first and second gates is capacitively coupled to the channel of the bilayer graphene layer. The local first and second gates form a first pair of gates to locally control a first portion of the bilayer graphene layer.

20 Claims, 7 Drawing Sheets

(51) Int. Cl.
  *H01L 29/49* (2006.01)
  *H01L 29/51* (2006.01)
  *H01L 21/02* (2006.01)
  *H01L 21/04* (2006.01)
  *H01L 29/423* (2006.01)
  *H01L 29/786* (2006.01)

(52) U.S. Cl.
  CPC ..... *H01L 29/1606* (2013.01); *H01L 29/42376* (2013.01); *H01L 29/42384* (2013.01); *H01L 29/4908* (2013.01); *H01L 29/4916* (2013.01); *H01L 29/517* (2013.01); *H01L 29/66015* (2013.01); *H01L 29/66742* (2013.01); *H01L 29/78645* (2013.01); *H01L 29/78648* (2013.01); *H01L 29/78684* (2013.01)

(56) References Cited

U.S. PATENT DOCUMENTS

| | | | |
|---|---|---|---|
| 6,320,202 | B1 | 11/2001 | Banerjee et al. |
| 6,759,285 | B2 | 7/2004 | Dennison et al. |
| 6,972,467 | B2 | 12/2005 | Zhang et al. |
| 7,087,475 | B2 | 8/2006 | Inoh |
| 7,385,262 | B2 | 6/2008 | O'Keeffe et al. |
| 7,491,594 | B2 | 2/2009 | Dao |
| 7,492,015 | B2 | 2/2009 | Chen et al. |
| 7,732,859 | B2 | 6/2010 | Anderson et al. |
| 9,076,873 | B2 * | 7/2015 | Chen et al. |
| 2002/0105039 | A1 | 8/2002 | Hanafi et al. |
| 2005/0212014 | A1 * | 9/2005 | Horibe et al. ............... 257/213 |
| 2007/0120200 | A1 | 5/2007 | Yun |
| 2008/0121996 | A1 | 5/2008 | Park et al. |
| 2008/0296689 | A1 | 12/2008 | Wang et al. |
| 2008/0312088 | A1 * | 12/2008 | Chung et al. ............... 505/193 |
| 2009/0020764 | A1 | 1/2009 | Anderson et al. |
| 2009/0140801 | A1 | 6/2009 | Ozyilmaz et al. |
| 2010/0006823 | A1 | 1/2010 | Anderson et al. |
| 2010/0059821 | A1 | 3/2010 | Rios et al. |
| 2013/0313522 | A1 * | 11/2013 | Nourbakhsh et al. ......... 257/29 |
| 2014/0077161 | A1 * | 3/2014 | Duan et al. .................... 257/29 |

OTHER PUBLICATIONS

E.V. Castro et al., "Biased Bilayer Graphene: Semiconductor with a Gap Tunable by Electric Field Effect," Physical Review Letters, Nov. 2007, 5 pages, vol. 94, No. 21, 216802.

S. Kim et al., "Realization of a High Mobility Dual-Gated Graphene Field-Effect Transistor with Al2O3 Dielectric," Applied Physics Letters, Sep. 2009, 3 pages, vol. 94, 062107.

B.N. Szafranek et al., "Electrical Observation of a Tunable Band Gap in Bilayer Graphene Nanoribbons at Room Temperature," Applied Physics Letter, Mar. 2010, 3 pages, vol. 96, 112103.

U.S. Appl. No. 12/563,553 filed in the name of Chen et al. on Sep. 21, 2009 and entitled "Local Bottom Gates for Graphene and Carbon Nanotube Devices.".

U.S. Appl. No. 12/612,018 filed in the name of Lin et al. on Nov. 4, 2009 and entitled "Graphene Based Switching Device Having a Tunable Bandgap.".

Search Report and Written Opinion of the International Searching Authority, dated May 3, 2012 for PCT/US11/66463.

* cited by examiner

GRAPHENE DEVICES WITH LOCAL DUAL GATES

CROSS-REFERENCE TO RELATED APPLICATIONS

This application is a Continuation of U.S. patent application Ser. No. 12/986,342, filed on Jan. 7, 2011, the entire contents of which are incorporated herein by reference. This application is also a Continuation of U.S. patent application Ser. No. 13/613,198, filed on Sep. 13, 2012, the entire contents of which are incorporated by reference herein.

FIELD OF THE INVENTION

The present invention relates to semiconductor structures, and particularly to local dual gates graphene based devices and methods of manufacturing the same.

BACKGROUND OF THE INVENTION

In a semiconductor material, band gap is an important parameter, which to a large extent determines properties of the semiconductor material. The band gap is defined as the difference in energy between the top of the valence band and the bottom of the conduction band. This is the energy that is required to excite an electron from the valence band into the conduction band. Electrons in the conduction band have the ability to move through the material, thereby enabling conduction of electricity.

One type of semiconductor material, graphene, is of great interest for nanoscale electronics due to the much higher carrier mobility compared to Silicon. Graphene is a two-dimensional planar sheet of carbon atoms arranged in a hexagonal benzene-ring structure. A free-standing graphene structure is theoretically stable only in a two-dimensional space, which implies that a planar graphene structure does not exist in a free state, being unstable with respect to formation of curved structures such as soot, fullerenes, and nanotubes. However, a two-dimensional graphene structure has been demonstrated on a surface of a three-dimensional structure, for example, on the surface of a Silicon Dioxide ($SiO_2$). A typical graphene layer may comprise a single sheet or multiple sheets of carbon atoms, for example, between 1 sheet and 10 sheets.

Field-effect transistor (FET) is a dominant and important device in fabricating integrated circuits. FET may be used for amplifying, switching, and detecting signals. In a FET device, the FET relies on an electric field to control the carrier density and hence the conductivity of a channel of one type of charge carrier. It is known that graphene has been used in forming a FET. Unfortunately, despite its high carrier mobility, graphene has a zero band gap, which leads to a very poor FET leakage current. One solution to this problem has been to use bi-layer graphene with both the top gate and the substrate to thereby open the band gap of the material. However, the substrate structure makes large-scale complementary-metal-oxide-semiconductor (CMOS) transistor impractical due to the lack of threshold voltage (Vt) control of an individual device.

SUMMARY OF THE INVENTION

The present invention relates to semiconductor structures, and particularly to local dual gates graphene based devices and methods of manufacturing the same. More specifically, the present invention provide techniques for forming a bilayer graphene layer device that includes a patterned top and bottom gates to bias different voltages on different devices on the same wafer to different band gap or threshold voltage (Vt) depending on the device and/or circuit requirement.

For example, in a first aspect, a method of forming an electronic device comprises forming an insulator, embedding a local first gate in the insulator with a top surface of the first gate being substantially coplanar with a surface of the insulator, depositing a first dielectric layer over the first gate and insulator, and forming a channel comprising a bilayer graphene layer formed on the first dielectric layer. The first dielectric layer provides a flat surface on which the channel is formed. The method further comprises depositing a second dielectric layer over the bilayer graphene layer and forming a local second gate over the second dielectric layer. Each of the local first and second gates is capacitively coupled to the channel of the bilayer graphene layer. The local first and second gates form a first pair of gates to locally control a first portion of the bilayer graphene layer.

The method may further comprise forming a local third gate embedded in the insulator with a top surface of the third gate being substantially coplanar with a surface of the insulator and forming a local fourth gate over the second dielectric layer. Each of the local third and fourth gates is capacitively coupled to the channel of the bilayer graphene layer. The local third and fourth gates form at least a second pair of gates to locally control at least a second portion of the bilayer graphene layer. The at least second pair of gates operates as gates of a second transistor.

In a second aspect of the invention, an electronic device comprises an insulator, a local first gate embedded in the insulator with a top surface of the first gate being substantially coplanar with a surface of the insulator, a first dielectric layer formed over the first gate and insulator, and a channel comprising a bilayer graphene layer formed on the first dielectric layer. The first dielectric layer provides a substantially flat surface on which the channel is formed. The device further comprises a second dielectric layer formed over the bilayer graphene layer and a local second gate formed over the second dielectric layer. Each of the local first and second gates is capacitively coupled to the channel of the bilayer graphene layer. The local first and second gates form a first pair of gates to locally control a first portion of the bilayer graphene layer.

In a third aspect of the invention, an integrated circuit includes at least one dual gate graphene layer device circuit. The at least one device circuit comprises an insulator, a local first gate embedded in the insulator with a top surface of the first gate being substantially coplanar with a surface of the insulator, a first dielectric layer formed over the first gate and insulator, and a channel comprising a bilayer graphene layer formed on the first dielectric layer. The first dielectric layer provides a substantially flat surface on which the channel is formed. The device further comprises a second dielectric layer formed over the bilayer graphene layer and a local second gate formed over the second dielectric layer. Each of the local first and second gates is capacitively coupled to the channel of the bilayer graphene layer. The local first and second gates form a first pair of gates to locally control a first portion of the bilayer graphene layer.

Advantageously, the above-described structure and techniques utilize the advantageous properties of graphene.

These and other objects, features, and advantages of the present invention will become apparent from the following detailed description of illustrative embodiments thereof, which is to be read in connection with the accompanying drawings.

DETAILED DESCRIPTION OF PREFERRED EMBODIMENTS

The present invention relates to graphene based electronic device, such as a field-effect transistor (FET) and methods of manufacturing the same. Graphene's bilayer electronic band structure has led to an interest of creating tunable band gap bilayer electronic devices such as a FET. In manufacturing of electronic devices, typically a wafer can hold multiple devices. The electronic device discussed herein includes patterned top and bottom gates to bias different voltages on different devices on the same wafer to different band gap or threshold voltage (Vt) depending on the device and/or circuit requirement. An advantage of using a patterned bottom gate is the ability to form CMOS logic devices and/or technologies with multiple device Vt offerings, which is common in today's semiconductor industry. For example, low Vt devices for high switching speed and high Vt devices for low power are usually provided on the same wafer.

Besides the lack of controllability of individual device Vt, non-patterned bottom gate means that a whole wafer shares the same bottom gate, which may lead to unrealistic high gate leakage from the bottom gate. In general, as the length of the gate electrode and the thickness of the gate oxide are decreased, an electronic device can be switched at higher speed. However, decreases in the thickness of the gate oxide can result in larger amount of leakage current flow through the gate oxide, and an excessive amount of standby power may be dissipated. The leakage current varies exponentially with the thickness of the gate oxide. This affects the circuit functionality.

To reduce the gate leakage problem, the top and bottom gates of the present invention are patterned. A band gap and a device threshold voltage (Vt) are determined by the biases from the bottom gate. With patterned bottom gate, each individual device on the same wafer can be independently tuned with different threshold voltage or band gap. For example, top and bottom gates of NFET (an electron conduction type device) and PFET (hole conduction type device) devices on the same wafer can have different biases.

Figure 1:
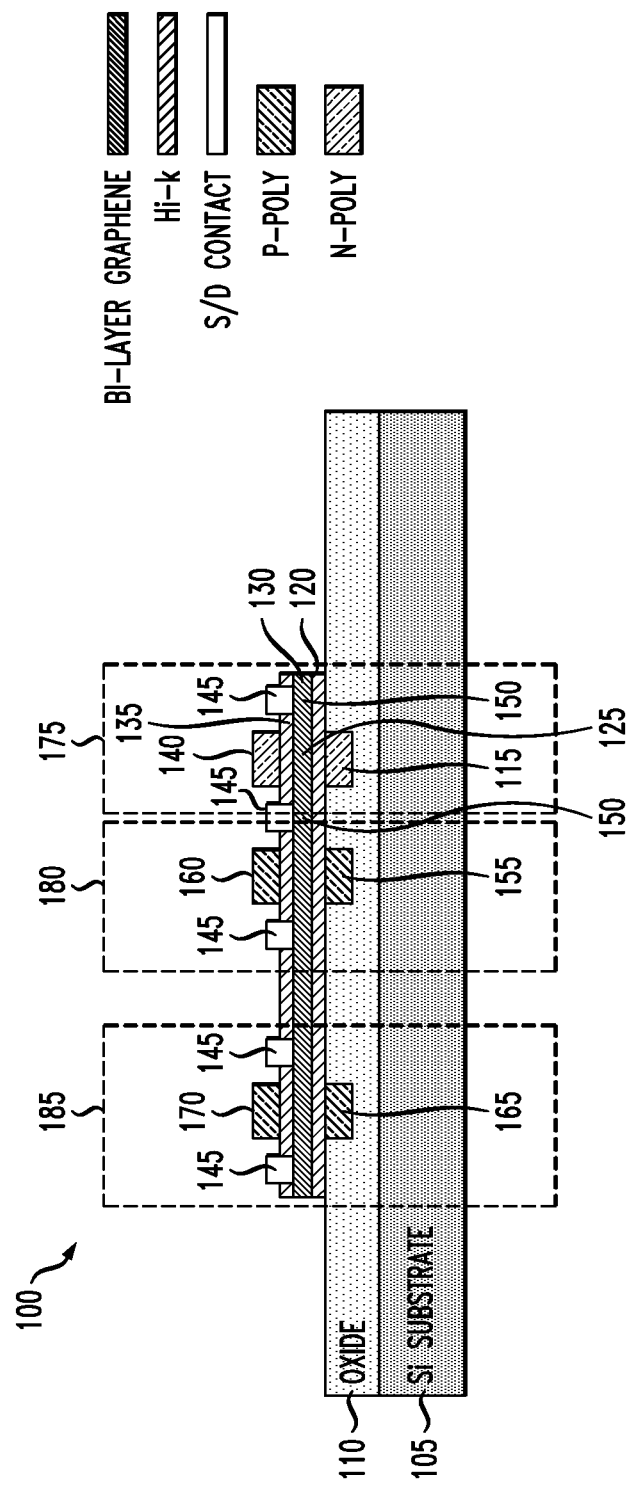
FIG. 1 shows an electronic device in accordance with an illustrative embodiment of the present invention.

FIG. 1 shows an exemplary tunable band gap electronic device 100, such as a FET device, in accordance with an illustrative embodiment of the present invention. The electronic device 100 includes a substrate 105 and an insulator 110 overlaying the substrate 105. A local first gate 115 is embedded in the insulator 110 with a top surface of the local first gate 115 being substantially coplanar with a surface of the insulator 110. A first dielectric layer 120 overlies the first gate 115 and insulator 110. A channel 125 forms from a bilayer graphene layer 130, which in turn, is formed on the first dielectric layer 120 over the local first gate 115. The first dielectric layer 120 that is over the first local gate 115 and the insulator 110 provides a flat surface on which the channel 125 is formed.

A second dielectric layer 135 forms over the bilayer graphene layer 130. A local second gate 140 forms over the second dielectric layer 135. Each of the local first and second gates 115, 140 is capacitively coupled to the channel of the bilayer graphene layer 130. The electronic device 100 further includes source/drain regions 150 that are connected by the channel 125. The first and second gates 115, 140 regulate electron flow through the channel 125. Although FIG. 1 illustrates three transistors 175, 180, 185 being manufactured on a single electronic device 100 on a single wafer, it should be understood that there may be more or fewer than three transistors. It should be further understood that other electronic devices may be manufactured on the electronic device 100 besides transistors.

Figure 2:
FIG. 2 shows a first top-down view of an electronic device in accordance with an illustrative embodiment of the present invention.
Figure 3:
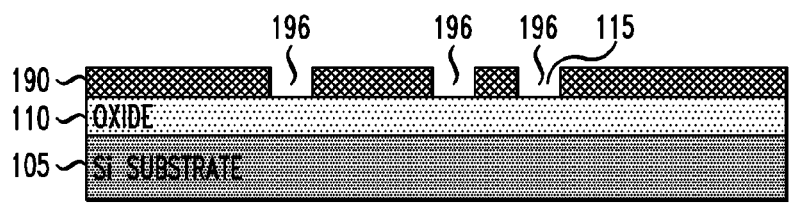
FIG. 3 shows a second top-down view of an electronic device in accordance with an illustrative embodiment of the present invention.

FIGS. 2-20 illustrate various fabrication steps that are employed in the present invention in fabricating the electronic device 100. As will be described herein, there are three transistors 175, 180, 185 on the electronic device 100. The first transistor 175 is an N-poly type transistor and the second and third transistors 180, 185 are p-type poly transistors. Referring to FIG. 2, a substrate 105 is provided. The substrate 105 is comprised of any material, which can be, but is not limited to silicon (Si). An oxide layer/insulator 110, for example, silicon dioxide ($SiO_2$), is formed on top of the substrate 105 using an oxidation process. The oxidation process involves heating the substrate 105, for example Si substrate to approximately 900 degrees Celsius to approximately 1200 degrees Celsius in atmosphere containing oxygen or water vapor. The oxygen or water diffuses to the substrate 105 surface and oxidation reaction occurs to form a thermal oxide layer with a thickness in the range between approximately three hundred (300) nanometer (nm) to one 1 micrometer (μm). The oxide layer 110 serves as an insulator into which a plurality of bottom gates 196 are formed as shown in FIG. 3. Although FIG. 3 shows three bottom gates 196, it should be understood that there may be fewer or more than three bottom gates on the device 100 that is on single wafer. The plurality of bottom gates 196 includes a first gate 115.

Following formation of the oxide layer 110 on the substrate 105, the device 100 is subjected to lithography. Lithography is typically the transfer of a pattern to a photosensitive material by selective exposure to a radiation source such as light. A photosensitive material is a material that experiences a change in its physical properties when exposed to a radiation source. By selectively exposing a photosensitive material to radiation (e.g. by masking some of the radiation) the pattern of the radiation on the material is transferred to the material exposed, as the property of the exposed and unexposed regions differs.

Figure 4:
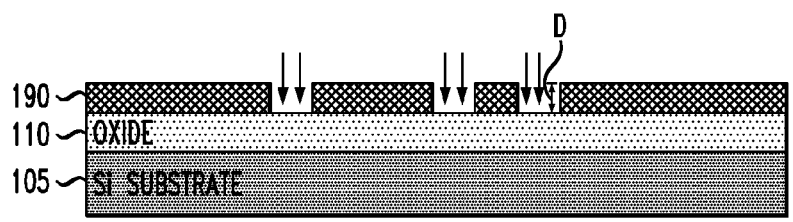
FIG. 4 shows a third top-down view of an electronic device in accordance with an illustrative embodiment of the present invention.
Figure 5:
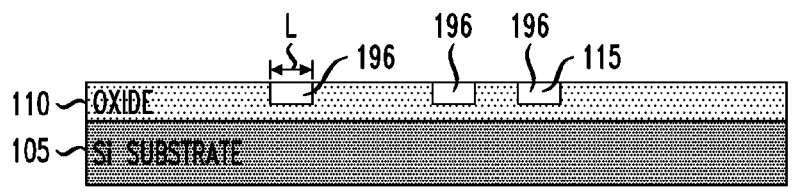
FIG. 5 shows a fourth top-down view of an electronic device in accordance with an illustrative embodiment of the present invention.
Figure 5:
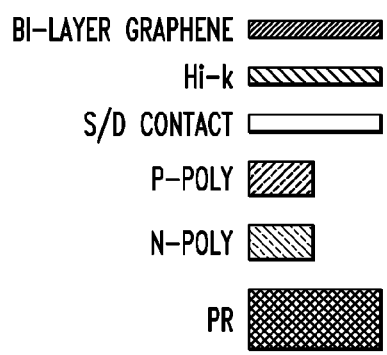

The lithography process includes applying a photoresist 190 to the oxide layer 110 (as shown in FIG. 3), exposing the photoresist 190 to a pattern of radiation, and developing the pattern into the photoresist 190 using a conventional resist developer) and dry etching such as reactive-ion etching (as shown in FIG. 4 by the arrows), ion beam etching, plasma-etching or laser ablation. The etching step may include a single etching process or multiple etching processes to provide the structure with at least one of the bottom gates 196 having depth of approximately 20 nm to approximately 300 nm as shown in FIG. 4 (labeled as "D"). After etching, the photoresist is removed from the structure utilizing a conventional stripping process well known to those skilled in the art as shown in FIG. 5. A trench length (labeled as "L") formed in at least one of the bottom gates 196 is approximately one (1) nm to approximately one (1) μm.

Figure 6:
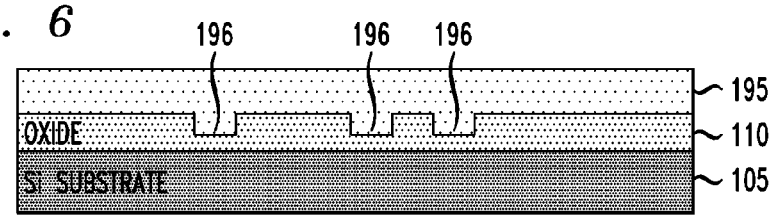
FIG. 6 shows a fifth top-down view of an electronic device in accordance with an illustrative embodiment of the present invention.
Figure 7:
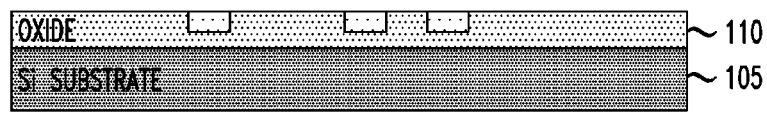
FIG. 7 shows a sixth top-down view of an electronic device in accordance with an illustrative embodiment of the present invention.
Figure 8:
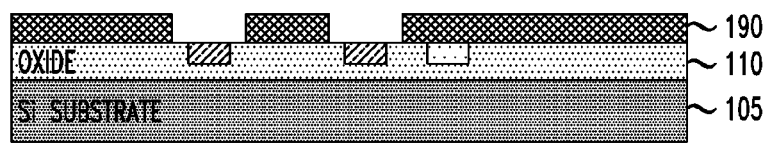
FIG. 8 shows a seventh top-down view of an electronic device in accordance with an illustrative embodiment of the present invention.

A film of polycrystalline silicon or polysilicon 195 (also known as poly-Si or poly) is formed over the insulator layer 110 including the bottom gates 196 as shown in FIG. 6. The film of polycrystalline silicon 195 has a thickness of approximately two hundred (200) nm to approximately seven hundred (700) nm. The polysilicon 195 is then subjected to chemical mechanical polishing (CMP) to produce a device with a structure as shown in FIG. 7. CMP is a process that is used for the planarization of semiconductor wafers. CMP takes advantages of the synergetic effect of both physical and chemical forces for polishing of wafers. This is done by applying a load force to the back of a wafer while it rests on a pad. Both the pad and wafer are then counter rotated while slurry containing both abrasives and reactive chemicals is passed underneath.

Following the CMP process, the device structure 100 is subjected to conventional lithography including applying a photoresist 190 on top of the oxide layer but exposing the second and third transistors 180, 185 ion implantation, specifically p-type poly ion implantation. The lithography process includes exposing the photoresist 190 to a pattern of radiation and developing the pattern into the photoresist using a conventional resist developer. The device 100 is then subjected to dry etching such as reactive-ion etching, ion beam etching, plasma-etching or laser ablation. The etching step may include a single etching process or multiple etching processes to provide the structure illustrated in FIG. 8.

Figure 9:
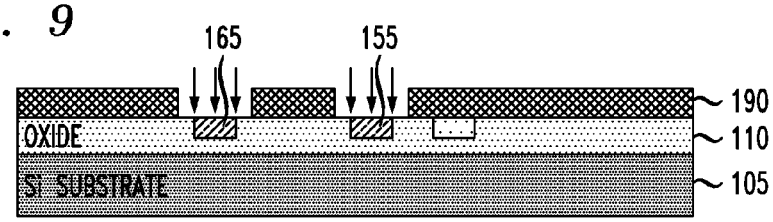
FIG. 9 shows an eighth top-down view of an electronic device in accordance with an illustrative embodiment of the present invention.
Figure 9:
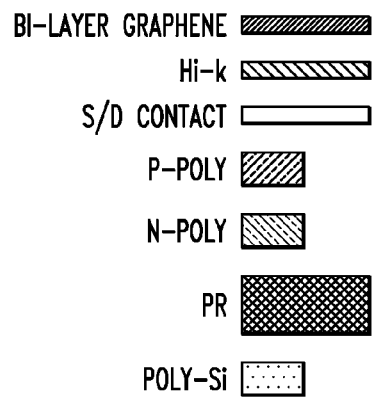
Figure 10:
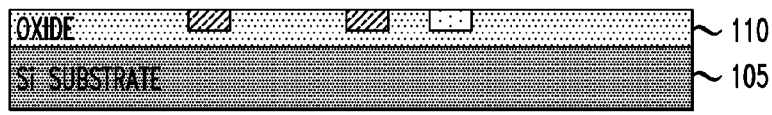
FIG. 10 shows a ninth top-down view of an electronic device in accordance with an illustrative embodiment of the present invention.

After etching, the device 100 is subjected to ion implantation to form source and drain regions 150 as shown in FIG. 9. An ion implantation process is performed to implant electrical dopants into the exposed portions of the bottom gates 196, that is, the portions that are not covered by the photoresist 190. More specifically, the local bottom gates 155, 165 of the second and third transistors 180, 185, respectively are doped with a p-type poly. However, the dopant ion can either be an n-type or p-type dopant. In one embodiment, boron (B) or boron difluoride ($BF_2$) implantation at a dose of from approximately 1E14 atoms/$cm^2$ to approximately 5E15 atoms/$cm^2$ is carried out at energy levels from approximately five (5) Kiloelectron-Volt (KeV) to approximately ten (10) KeV for the local bottom gates 155, 165 of the second and third transistors 180, 185, respectively. Other dopants may include Aluminum (Al), Gallium (Ga), Indium (In), Phosphorus (P), Argon (Ar), Antimony (Sb), and a combination thereof. The angle, dose, and the energy of the ion implantation may be selected to provide high conductivity to the source and drain regions 150 to minimize the source and drain resistance of the transistor to be formed. The photoresist is then removed utilizing a conventional stripping process well known to those skilled in the art to provide the structure as illustrated in FIG. 10.

Figure 11:
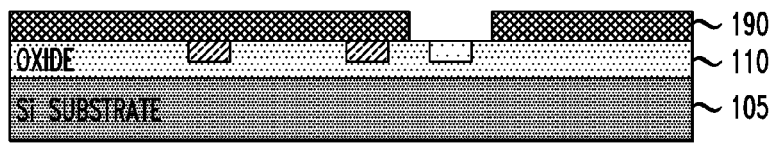
FIG. 11 shows a tenth top-down view of an electronic device in accordance with an illustrative embodiment of the present invention.
Figure 12:
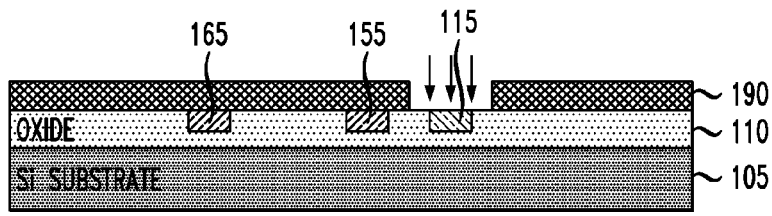
FIG. 12 shows an eleventh top-down view of an electronic device in accordance with an illustrative embodiment of the present invention.
Figure 13:
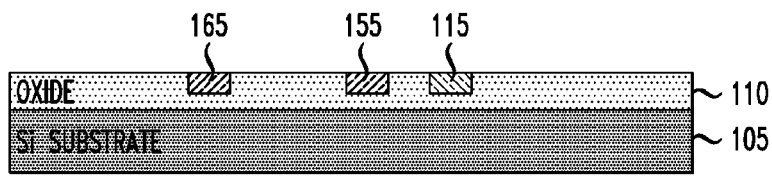
FIG. 13 shows a twelfth top-down view of an electronic device in accordance with an illustrative embodiment of the present invention.
Figure 13:
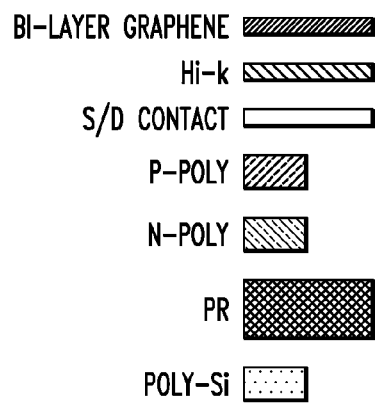

The next step is to create an n-type poly in the first transistor 175. In order to create the first transistor 175 with the n-type poly, the device 100 is subjected to lithography. The process includes applying another photoresist 190 over the oxide layer 110 and the local third and fifth 155, 165 but exposing the local first gate 115 as shown in FIG. 11. The lithography process further includes exposing the photoresist 190 to a pattern of radiation, and developing the pattern into the photoresist 190 using a conventional resist developer and dry etching such as reactive-ion etching, ion beam etching, plasma-etching or laser ablation. The etching step may include a single etching process or multiple etching processes to provide the structure with at least one of the bottom gates 196 having depth of approximately 100 nm. After etching, the device 100 is subjected to ion implantation as shown in FIG. 12. In one embodiment, an n-type material such as phosphorus (P) or arsenic (As) is implanted to the local first bottom gate 115 of the first transistor 175. The photoresist 190 is then removed utilizing a conventional stripping process well known to those skilled in the art to provide the structure as illustrated in FIG. 13.

Following the implantation step, the device 100 is subjected to a rapid thermal anneal (RTA) process at, for example, approximately one thousand (1,000) degrees Celsius for about five (5) seconds, which serves to diffuse the dopant ions. For example, the activation annealing step is performed in an inert atmosphere such as helium (He), argon (Ar) or a mixture thereof at a temperature of about seven hundred (700) degrees Celsius or higher for a time period of approximately one (1) minute or greater. As shown in FIG. 13, the local first bottom gate 115 is an n-type poly gate and the local bottom gates 155, 165 are p-type poly gates.

Figure 14:
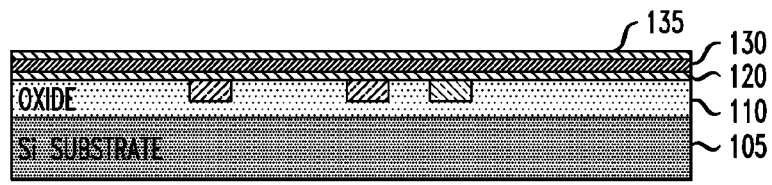
FIG. 14 shows a thirteenth top-down view of an electronic device in accordance with an illustrative embodiment of the present invention.

Following ion implantation a first dielectric layer 120 is deposited over the oxide layer 110 and portions of the bottom gate region 196 as shown in FIG. 14. The first dielectric layer 120 may comprise a high-k dielectric material such as Hafnium Oxide ($HFO_2$), Zirconium Oxide ($ZrO_2$), Aluminum Oxide ($Al_2O_3$), Titanium Dioxide ($TiO_2$), Lanthanum Oxide ($La_2O_3$), Strontium Titanate ($SrTiO_3$), Lanthanum Aluminate ($LaAlO_3$), hafnium silicates ($HfSi_xO_y$), barium-strontium-titanates (BSTs) or lead-zirconate-titanates (PZTs). The gate dielectric materials may be formed by atomic layer deposition (ALD), thermal or plasma oxidation, thermal or plasma nitridation, chemical vapor deposition (CVD), and/or physical vapor deposition (PVD). The total thickness of the dielectric layer 120 is in the range from approximately 0.5 nm to approximately 30 nm. Alternately, the dielectric layer 120 may comprise a conventional gate dielectric, such as silicon oxide or silicon nitride, that is deposited by chemical vapor deposition to similar thicknesses. A bilayer graphene layer 130 is then formed over the dielectric layer 120.

The bilayer graphene layer 130 may be grown by solid state graphitization. Carbon atoms are sublimated during the graphitization process from the silicon carbide surfaces to form the bilayer graphene layer 130. Other well-known processes of forming the bilayer graphene layer 130 may also be utilized to those skilled in the art.

A second dielectric layer 135 is formed over the bilayer graphene layer 130. The second dielectric layer 135 may comprise a high-k dielectric material such as $HFO_2$, $ZrO_2$, $Al_2O_3$, $TiO_2$, $La_2O_3$, $SrTiO_3$, $LaAlO_3$, hafnium silicates, barium-strontium-titanates (BSTs) or lead-zirconate-titanates (PZTs). The gate dielectric materials may be formed by atomic layer deposition (ALD), thermal or plasma oxidation, thermal or plasma nitridation, chemical vapor deposition (CVD), and/or physical vapor deposition (PVD). The total thickness of the second dielectric layer 135 is in the range from approximately 0.5 nm to approximately 30 nm. Alternately, the second dielectric layer 135 may comprise a conventional gate dielectric, such as silicon oxide or silicon nitride, that is deposited by chemical vapor deposition to similar thicknesses.

Figure 15:
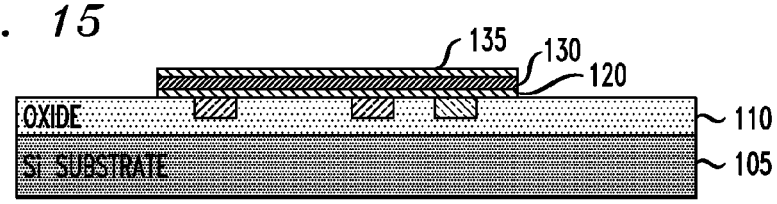
FIG. 15 shows a fourteenth top-down view of an electronic device in accordance with an illustrative embodiment of the present invention.
Figure 16:
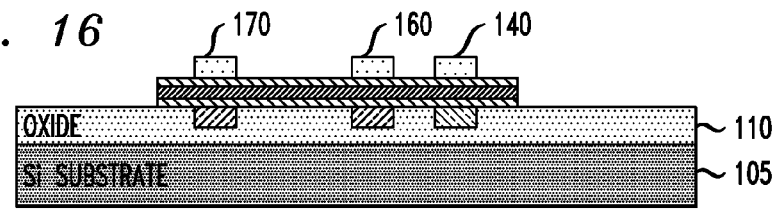
FIG. 16 shows a fifteenth top-down view of an electronic device in accordance with an illustrative embodiment of the present invention.

Following formation of the second dielectric layer 135 as shown in FIG. 15, the device 100 is subjected to photolithography and etches to pattern the top local gates 140, 160, 170 as shown in FIG. 16. The photolithography process includes lift-off to pattern the top local gates 135, 160, 170.

Figure 17:
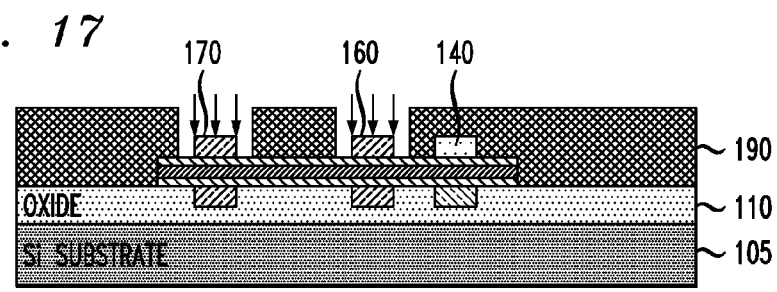
FIG. 17 shows a sixteenth top-down view of an electronic device in accordance with an illustrative embodiment of the present invention.

A photoresist layer 190 is then deposited to cover the local second top gate 140 and expose the local fourth and sixth gates 160, 170. An ion implantation process is performed to dope the local fourth and sixth gates 160, 170, for example, with a p-type poly as shown in FIG. 17. However, the dopant ion can either be an n-type or p-type dopant. The photoresist layer 190 is then removed utilizing a conventional stripping process well known to those skilled in the art.

Figure 18:
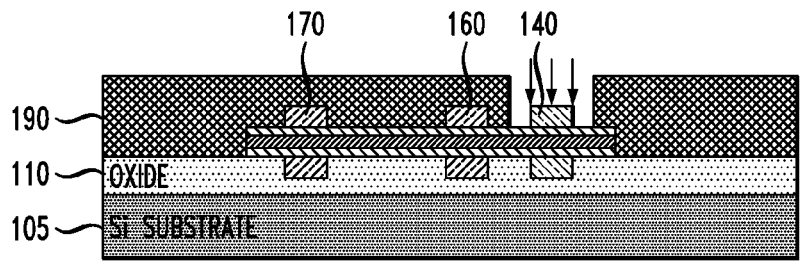
FIG. 18 shows a seventeenth top-down view of an electronic device in accordance with an illustrative embodiment of the present invention.
Figure 19:
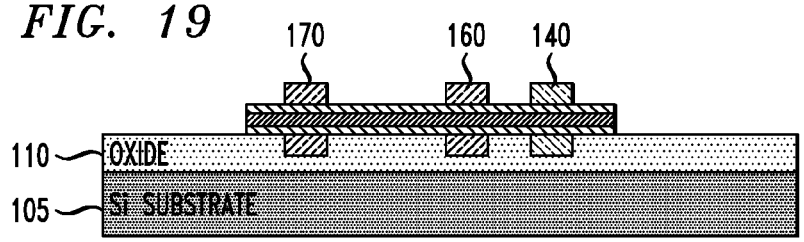
FIG. 19 shows an eighteenth top-down view of an electronic device in accordance with an illustrative embodiment of the present invention.

The next step is to create an n-type poly in the first transistor 175. In order to create the first transistor 175 with the n-type poly, the device 100 is subjected to lithography. The process includes applying another photoresist 190 covering the local fourth and sixth gates 160, 170 while exposing the local second gate 140 as shown in FIG. 18. The lithography process further includes exposing the photoresist 190 to a pattern of radiation, and developing the pattern into the photoresist 190 using a conventional resist developer and dry etching such as reactive-ion etching, ion beam etching, plasma-etching or laser ablation. The etching step may include a single etching process or multiple etching processes to provide the structure with at least one of the top gates 197 having depth of approximately 100 nm. After etching, the device 100 is subjected to ion implantation. In one embodiment, an n-type material such as phosphorus (P) or arsenic (As) is implanted to the local second top gate 140 of the first transistor 175. The photoresist is then removed utilizing a conventional stripping process well known to those skilled in the art to provide the structure as illustrated in FIG. 19.

Figure 20:
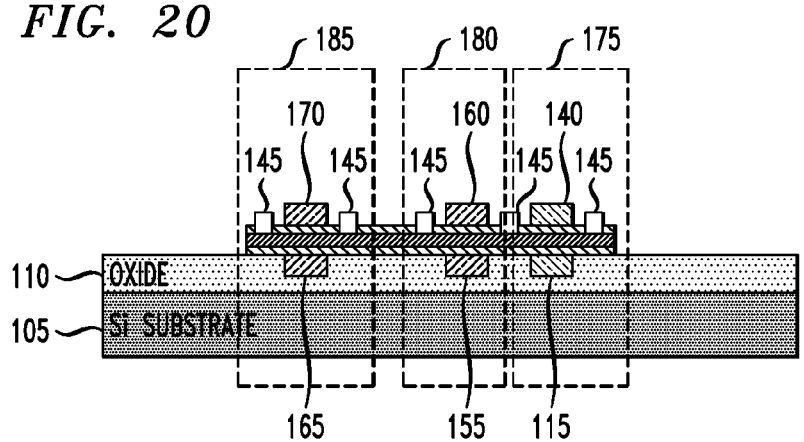
FIG. 20 shows a nineteenth top-down view of an electronic device in accordance with an illustrative embodiment of the present invention.

After the formation of the source and drain regions 150, contacts 145 are formed for each source/drain region 150 as shown in FIG. 20. FIG. 20 also shows that there are three transistors 175, 180, 185 on the electronic device 100, which is on a single wafer. The local first and second gates 115, 140 forms a first pair of gates to locally control a first portion of the bilayer graphene layer 130. The first pair of gates operates as gates of the first transistor 175.

The local third and fourth gates 155, 160 form a second pair of gates to locally control a second portion of the bilayer graphene layer 130. The second pair of gates operates as gates of the second transistor 180.

The local fifth and sixth gates 165, 170 form a third pair of gates to locally control a third portion of the bilayer graphene layer 130. The third pair of gates operates as gates of the third transistor 185.

Each pair of gates have patterned top and bottom gates to bias different voltages on different transistors 175, 180, 185 on the same device 100 to different band gap or threshold voltage depending on the device and/or circuit requirement. The band gap and device threshold voltage are determined by the biases from the bottom gate. With patterned bottom gate, each individual transistor 175, 180, 185 on the same device 100 can be independently tuned with different threshold voltage or band gap.

Figure 21:
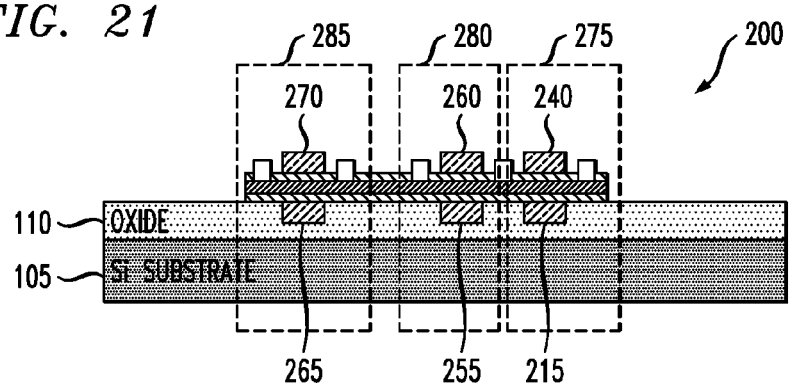
FIG. 21 shows an alternative electronic device in accordance with an illustrative embodiment of the present invention.

FIG. 21 illustrates another embodiment of a device 200. Device 200 is similar to device 100 with the exception that all the gates are doped with n-type or p-type dopants. For example, all of the local gates 215, 240, 255, 260, 265, 270 are n-type dopants. Alternatively, all of the local gates 215, 240, 255, 260, 265, 270 are p-type dopants. As a result of all the gates being similarly doped, the three transistors 275, 280, 285 are of the same type. Unlike device 100 where the Vt is partially controlled by the gate bias conditions and partially controlled by the gate work functions (e.g., doping), the Vt of device 200 is completely controlled by the gate bias conditions.

Figure 22:
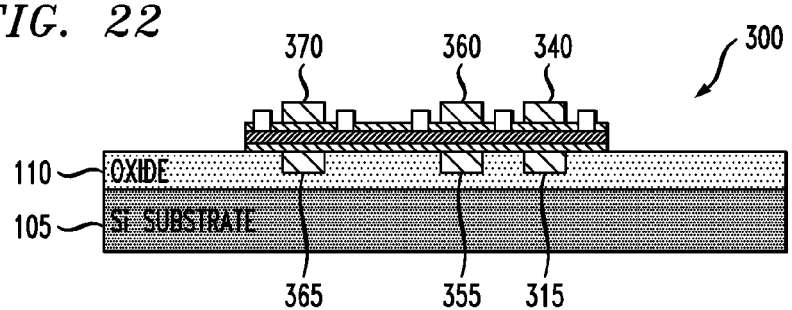
FIG. 22 shows another alternative electronic device in accordance with an illustrative embodiment of the present invention.

FIG. 22 illustrates another embodiment of a device 300. Device 300 is similar to device 100 with the exception that all of the local gates 315, 340, 355, 360, 365, 370 are single type metal. For example, the local gates 315, 340, 355, 360, 365, 370 are made of, for example, aluminum or tungsten material. As such, the ion implantation steps are skipped to manufacture device 300.

Figure 23:
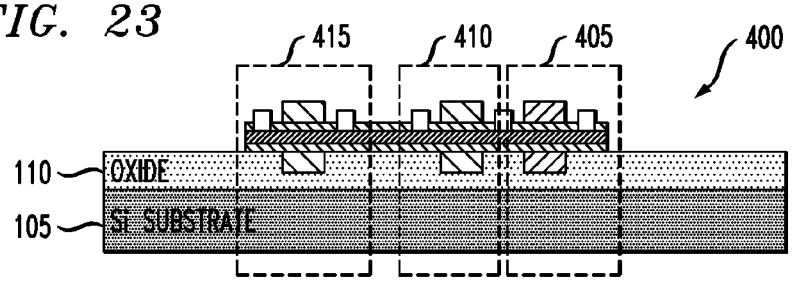
FIG. 23 shows yet another alternative electronic device in accordance with an illustrative embodiment of the present invention.

FIG. 23 illustrates another embodiment of a device 400. Device 400 is similar to device 300 with the exception that there are two types of metal as gates. For example, a first pair of gates 405 operates as gates to control an n-type field-effect transistor (FET). The first pair of gates 405 may have metal gates made of, for example, aluminum. The second pair and third pair of gates 410, 415 may be another metal material, for example, tungsten to create a p-type FET.

At least a portion of a dual gate graphene device circuit of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of forming an electronic device comprising:
   forming an insulator;
   embedding a local first gate in the insulator with a top surface of the first gate being substantially coplanar with a surface of the insulator;
   depositing a first dielectric layer over the first gate and insulator;
   forming a channel comprising a bilayer graphene layer formed on the first dielectric layer, wherein the first dielectric layer provides a substantially flat surface on which the channel is formed;
   depositing a second dielectric layer over the bilayer graphene layer, wherein the bilayer graphene layer provides a substantially flat surface on which the second dielectric layer is deposited; and
   forming a local second gate over the second dielectric layer, each of the local first and second gates configured to be capacitively coupled to the channel of the bilayer graphene layer;
   wherein the local first and second gates form a first pair of gates to locally control a first portion of the bilayer graphene layer; and
   wherein the local first gate is controllable independent of the local second gate.

2. The method of claim 1, wherein the first pair of gates operates as gates of a first transistor.

3. The method of claim 2, further comprising:
   forming a local third gate embedded in the insulator with a top surface of the third gate being substantially coplanar with a surface of the insulator; and
   forming a local fourth gate over the second dielectric layer, each of the local third and fourth gates configured to be capacitively coupled to the channel of the bilayer graphene layer;
   wherein the local third and fourth gates form at least a second pair of gates to locally control at least a second portion of the bilayer graphene layer;
   wherein the at least second pair of gates operates as gates of a second transistor; and
   wherein the local third gate is controllable independent of the local fourth gate.

4. The method of claim 3, wherein at least one of the local first, second, third and fourth gates comprises metal material.

5. The method of claim 3, wherein at least one of the local first, second, third and fourth gates having a channel length of about one (1) nm to about one (1) μm.

6. The method of claim 3, wherein at least one of the local first, second, third and fourth gates comprises poly-silicon.

7. The method of claim 3, wherein the first transistor has a threshold voltage that is determined by the local first and second gates.

8. The method of claim 3, wherein the at least second transistor has a threshold voltage that is determined by the local third and fourth gates.

9. The method of claim 3, wherein the local first gate and the local second gate comprise poly-silicon doped with a first dopant type and the local third gate and the local fourth gate comprise poly-silicon doped with a second dopant type different than the first dopant type.

10. The method of claim 3, wherein the local first gate and the local second gate comprise a first metal and the local third gate and the local fourth gate comprise a second metal different than the first metal.

11. The method of claim 3, further comprising patterning the local first, second, third and fourth gates, wherein the local first gate and the local third gate bias different voltages on the first and second transistors, respectively.

12. The method of claim 1, wherein at least one of the first and second dielectric layers comprises one or more of aluminum oxide and hafnium oxide.

13. The method of claim 1, wherein the insulator is a first material type and the first dielectric layer is a second material type different than the first material type.

14. The method of claim 1, wherein the local first gate and the local second gate are formed of a same material type.

15. The method of claim 3, wherein the local first gate and the local second gate are formed of a first material type and the local third gate and the local fourth gate are formed of a second material type different than the first material type.

16. The method of claim 1, further comprising forming source and drain regions connected by the channel.

17. The method of claim 16, further comprising forming a contact on each of the source and drain regions.

18. The method of claim 1, wherein forming the channel comprises growing the bilayer graphene layer using solid state graphitization.

19. A method of forming an electronic device comprising:
   forming an insulator;
   embedding a local first gate in the insulator with a top surface of the first gate being substantially coplanar with a surface of the insulator;
   depositing a first dielectric layer over the first gate and insulator;
   forming a channel comprising a bilayer graphene layer formed on the first dielectric layer;
   depositing a second dielectric layer over the bilayer graphene layer; and forming a local second gate over the second dielectric layer, each of the local first and second gates configured to be capacitively coupled to the channel of the bilayer graphene layer;

wherein the local first and second gates form a first pair of gates to locally control a first portion of the bilayer graphene layer; and wherein the local first gate is controllable independent of the local second gate.

20. The method of claim 19, wherein the electronic device comprises an integrated circuit.

* * * * *